US012560487B2

(12) United States Patent
Laloyaux et al.

(10) Patent No.: US 12,560,487 B2
(45) Date of Patent: Feb. 24, 2026

(54) GLAZING THERMAL SENSOR

(71) Applicant: AGC GLASS EUROPE, Louvain-la-Neuve (BE)

(72) Inventors: Xavier Laloyaux, Gosselies (BE); Jean Masson, Gosselies (BE); Yannick Sartenaer, Vedrin (BE)

(73) Assignee: AGC GLASS EUROPE, Louvain-la-Neuve (BE)

( * ) Notice: Subject to any disclaimer, the term of this patent is extended or adjusted under 35 U.S.C. 154(b) by 413 days.

(21) Appl. No.: 18/041,416

(22) PCT Filed: Aug. 19, 2021

(86) PCT No.: PCT/EP2021/073048
§ 371 (c)(1),
(2) Date: Feb. 13, 2023

(87) PCT Pub. No.: WO2022/043183
PCT Pub. Date: Mar. 3, 2022

(65) Prior Publication Data
US 2023/0324231 A1        Oct. 12, 2023

(30) Foreign Application Priority Data

Aug. 28, 2020     (EP) ..................................... 20193474

(51) Int. Cl.
*G01K 1/14*        (2021.01)
*H05B 1/02*        (2006.01)
(Continued)

(52) U.S. Cl.
CPC ............. *G01K 1/14* (2013.01); *H05B 1/0236* (2013.01); *H05B 3/84* (2013.01); *H05K 1/181* (2013.01);
(Continued)

(58) Field of Classification Search
CPC .................................................. H05B 1/0236
See application file for complete search history.

(56) References Cited

U.S. PATENT DOCUMENTS 6,422,062 B1    7/2002  King et al.
7,028,531 B2 *  4/2006  Nikolaus ................ G01N 19/10
                                                      73/29.05
(Continued)

FOREIGN PATENT DOCUMENTS

DE      20 2017 102 708 U1     5/2017
EP          0 408 853 A2       1/1991
(Continued)

OTHER PUBLICATIONS

Urbank et al , "Development and Application of an Integrated Dew Point and Glass Temperature Sensor", SAE Transactions , 2001, vol. 110, Section 6: Journal of Passenger Car: Mechanical Systems Journal (2001), pp. 546-556 (Year: 2001).*
(Continued)

*Primary Examiner* — John E Breene
(74) *Attorney, Agent, or Firm* — Oblon, McClelland, Maier & Neustadt, L.L.P.

(57) ABSTRACT

A glazing includes a temperature sensing device for measuring the temperature of the glazing. The temperature sensing device is fixed to the glazing through a thermally conductive double-sided tape.

12 Claims, 2 Drawing Sheets

(51) Int. Cl.
| | |
|---|---|
| H05B 3/84 | (2006.01) |
| H05K 1/18 | (2006.01) |
| H05K 1/181 | (2026.01) |

(52) U.S. Cl.
CPC .................. *H05B 2203/002* (2013.01); *H05K 2201/10151* (2013.01)

(56) References Cited

U.S. PATENT DOCUMENTS

| | | | | |
|---|---|---|---|---|
| 2006/0289458 A1* | 12/2006 | Kim et al. | ............... | H05B 1/02 |
| | | | | 219/497 |
| 2010/0206047 A1 | 8/2010 | No et al. | | |
| 2017/0332446 A1 | 11/2017 | Salter et al. | | |
| 2022/0194172 A1* | 6/2022 | Coufal et al. | ...... | B60H 1/00785 |
| | | | | 1/785 |

FOREIGN PATENT DOCUMENTS

| | | | |
|---|---|---|---|
| WO | WO 2009/044942 A1 | 4/2009 | |
| WO | WO 2014/008173 A1 | 1/2014 | |

OTHER PUBLICATIONS

Wang et al, "Clear Vision Automatic Windshield Defogging System"Author(s): Mingyu Wang, Thomas M. Urbank and Karma V. SangwanSource: SAE Transactions, 2004, vol. 113, Section 6: Journal of Passenger Cars: Mechanical Systems Journal (2004), pp. 939-947 (Year: 2004).*

Urbank et al (Year: 2001).*

Wang et al (Year: 2004).*

International Search Report issued Nov. 19, 2021 in PCT/EP2021/073048 filed Aug. 19, 2021, 4 pages.

* cited by examiner

GLAZING THERMAL SENSOR

FIELD OF THE INVENTION

The present invention generally relates to the field of glazing equipped with sensing devices. More particularly it relates to a glazing comprising a temperature sensing device for measuring the temperature of the glazing.

The present invention also relates to a temperature sensing device for measuring the temperature of a glazing.

BACKGROUND OF THE INVENTION

Nowadays it is useful to be able to heat a glazing. Such glazing can be used in a large variety of applications, such as in building or in automotive. Heating a glazing allows to defog as well as to defrost the glazing. Defogging and/or defrosting a glazing is of paramount importance in the domain of autonomous driving. The sensors (cameras, lidar, rain sensor, light sensor, . . . ) behind the glazing must be able to detect without perturbations due to fog and/or ice on the glazing.

Going together with heating a glazing, knowing the temperature of the glazing allows to know when to activate or inactivate the heating function. In order to measure the temperature of the glazing itself, the temperature sensor is usually welded on the glazing itself. As explained in EP2896269, even if lead-containing solders have high ductility that can compensate the mechanical stresses occurring between an electrical connection element and the glazing, the End of Life Vehicles Directive 2000/53/EC does not allow to use lead-containing solders. The aim of this directive is to ban extremely problematic components from products resulting from the massive increase in disposable electronics. It applies in the automotive sector, but it can also have significant advantages in other applications as using lead-free solder is better for the environment.

A number of electrical connection elements for lead-free soldering to electrically conductive structures have been proposed. Reference is made, by way of example, to US20070224842, EP1942703, WO2007110610, EP1488972 and EP2365730. The shape (thickness, size, . . . ) and the material of the piece to be welded, as well as the solder assume critical significance with regard to the avoidance of thermal stresses. If not chosen properly, it may results in cracks at the solder with risk of bad connection and even detachment of the piece to be welded. Welding a temperature sensor on a glazing is indeed a complex procedure.

There is also a need to measure the temperature with a sensor which would be small enough for a large variety of applications. Nowadays, especially but not only in the automotive sector, the tendency is to the miniaturization of electronic components. It allows to place these electronic components in places that were not accessible before and/or to put more electronic pieces on the same place.

There is therefore a need for a solution to measure the temperature of a glazing without the drawbacks of the prior art.

SUMMARY OF THE INVENTION

The present invention concerns a glazing comprising a temperature sensing device for measuring the temperature of said glazing. The temperature sensing device comprises a first printed circuit board having a first face and a second face. The temperature sensing device also comprises a thermistor fixed on the said first face of the printed circuit board. The temperature sensing device also comprises a first couple of connectors connected to the thermistor and surfacing the said second face of the printed circuit board. The temperature sensing device also comprises a thermally conductive double-sided tape fixed on the said first face of the printed circuit board. The temperature sensing device is fixed to the glazing through the thermally conductive double-sided tape.

The invention also proposes a temperature sensing device.

BRIEF DESCRIPTION OF THE DRAWINGS

The invention will now be described further, by way of examples, with reference to the accompanying drawings, wherein like reference numerals refer to like elements in the various figures. These examples are provided by way of illustration and not of limitation. The drawings are a schematic representation and not true to scale. The drawings do not restrict the invention in any way. More advantages will be explained with examples.

DETAILED DESCRIPTION OF ILLUSTRATIVE EMBODIMENTS

Figure 1A:
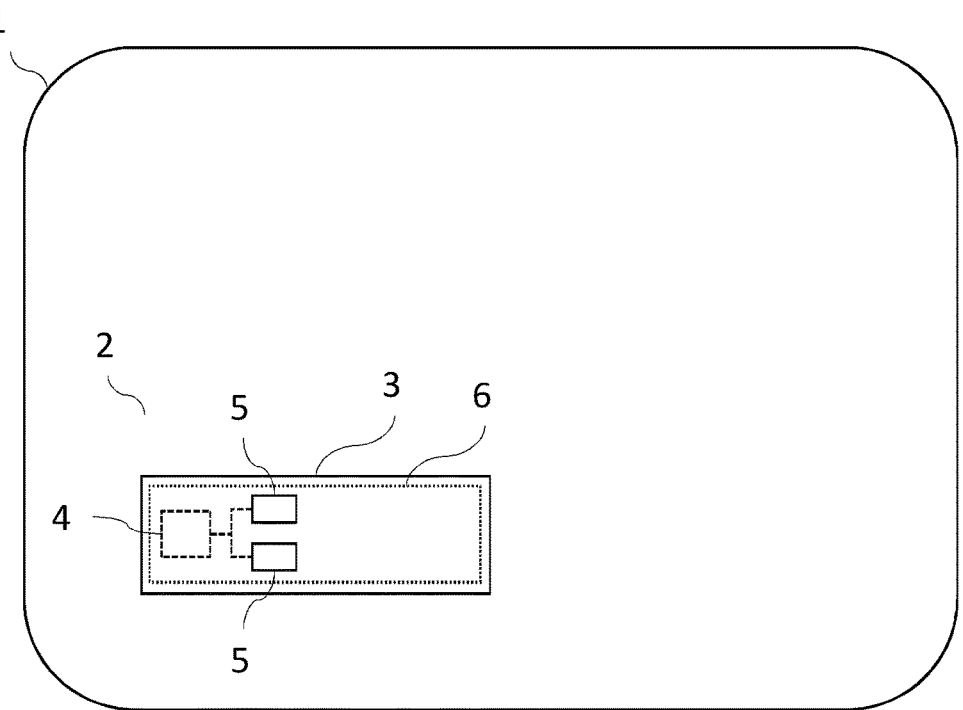
FIG. 1a illustrates a first embodiment of the present invention.

The present invention will be described with respect to particular embodiments and with reference to certain drawings but the invention is not limited thereto but only by the claims.

While some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

The present invention proposes a glazing comprising a temperature sensing device for measuring the temperature of the glazing.

The temperature sensing device comprises a first printed circuit board having a first face and a second face. A printed circuit board (PCB) mechanically supports and electrically connects electrical or electronic components using conductive tracks, pads and other features etched from one or more sheet layers of copper laminated onto and/or between sheet layers of a non-conductive substrate. Components are generally soldered onto the PCB to both electrically connect and mechanically fasten them to it.

The PCB is not specifically positioned on the warmest point of the glazing but on the most appropriate to avoid disturbance with an eventual optical and/or heating function. The temperature threshold of the controlling system is adjusted for the PCB localization on the glazing according to thermal simulation in order to guarantee that the glazing temperature does not exceed the safety temperature during heating.

Using a PCB offers the advantages of a very simple and low-cost element. It also permits to easily add any components, such as a chip able to perform the regulation of the temperature or a processor to add further features to the temperature sensing device.

The temperature sensing device also comprises a thermistor fixed on the said first face of the printed circuit board. A thermistor is a type of resistor whose resistance is dependent on temperature. It can therefore furnish information about temperature. There also exist electronic thermistors which give a signal with a frequency varying depending on the temperature. The thermistor can be welded to the first printed circuit board, or any other mean known from the one skilled in the art to fix a component to a printed circuit board. A thermistor is a low-cost component.

The temperature sensing device also comprises a first couple of connectors. These connectors are connected to the thermistor and surface the second face of the printed circuit board. These connectors allow to connect to the thermistor for example to provide current to the thermistor and/or to retrieve information about temperature from the thermistor.

The temperature sensing device also comprises a thermally conductive double-sided tape. The thermally conductive double-sided tape is fixed on the first face of the printed circuit board. The thermally conductive double-sided tape allow to fix the printed circuit board to the glazing, and therefore the temperature sensing device to the glazing. As the thermally conductive double-sided tape is in contact with the glazing, it lets the thermistor measure the temperature of the glazing.

The thermally conductive double-sided tape is a low-cost element. It also allows a very simple way to fix the temperature sensing device on a glazing, especially compared to a temperature sensing device which is welded on a glazing. It also offers the advantage of applying very low constraint on the glazing itself.

The present invention presents the advantage of being low-cost, as the components are low-cost themselves. It also presents a relative small footprint, which can be of great importance especially in the automotive sector.

According to an embodiment of the present invention, the volume of the printed circuit board is less than 0.22 cm$^3$ and its largest area less than 1.1 cm$^2$.

According to a second embodiment of the present invention, the glazing further comprises a silverprint distributed on the glazing. The silverprint is connected to a second couple of connectors which surfaces the second face of the printed circuit board. This second couple of connectors allows to put current on the silverprint and therefore to heat the glazing.

There exists other ways to heat the glazing, as known by the skilled in the art, such as the use of an embedded conductive wire or a conductive coating distributed on the glazing. These other methods can also be used instead of the silverprint previously mentioned.

According to an embodiment of the present invention, the glazing is the cover glass of a camera or a lidar. The glazing could also be the cover glass of any kind of sensor using a cover glass, such as a rain sensor, a light sensor and the like.

According to an embodiment of the present invention, the glazing is a windshield, a sidelite or a backlite of an automotive vehicle. An automotive vehicle includes cars, vans, lorries, construction and mining machines, industrial vehicles, motorbikes, buses, trams, trains, airplanes, helicopters and the like. The glazing could also be used on a drone, on a wind turbine, on a metrology equipment, on a weather station, on a traffic analysis system, on a security and/or crowd analysis system or on an industrial robot.

According to an embodiment of the present invention, the glazing is a trim element of an automotive vehicle. A trim element refers to the items that can be added to the interior or exterior of an automotive vehicle to increase its appeal or to mask some unaesthetic parts. Some are used to protect some part of the interior or exterior vehicle from unwanted damage that can be caused by the passenger, while others are simply for aesthetics. For example glass trim elements are used as car trunk cover, cover for A-, B-, C-, D-pillars (vertical or near vertical supports of a car's window area-designated respectively as the A, B, C or (in larger cars) D-pillars, moving from the front to rear, in profile view) or interior trim element on the dashboard, console, door trim, . . . . Such glass trim elements are described in patent applications EP3325417, EP3325418 and EP3429893 which are integrated in the present description by reference.

The present invention also proposes a temperature sensing device as described previously.

Referring to FIG. 1a, a glazing (1) comprises a temperature sensing device (2).

The temperature sensing device (2) comprises a first printed circuit board (3) having a first face and a second face.

A thermistor (4) is fixed on the first face of the printed circuit board (3). The thermistor (4) is represented as a dotted rectangle in the figure to represent the fact it is underneath the first printed circuit board (3) in this view.

The temperature sensing device (2) also comprises at least a first couple of connectors (5) connected to the thermistor (4). These connectors (5) cross the first printed circuit board (3) to surface the second face of the printed circuit board (3).

The first face of the printed circuit board (3), on which the thermistor (4) is fixed, is at least partially covered with a thermally conductive double-sided tape (6). The thermally conductive double-sided tape (6) is represented as a dotted rectangle in the figure to represent the fact it is underneath the first printed circuit board (3) in this view.

Figure 1B:
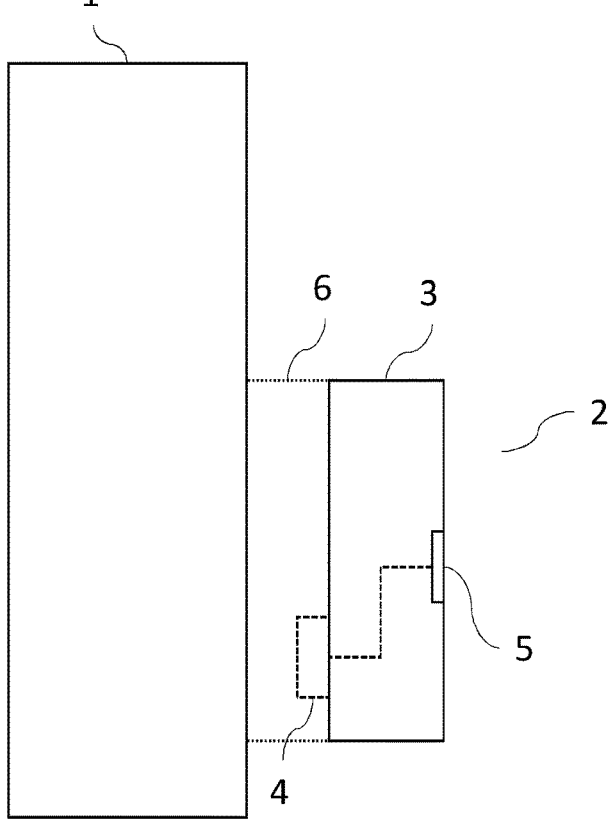
FIG. 1b illustrates a sectional view of the first embodiment of the present invention.

FIG. 1b represents a sectional view of the temperature sensing device (2) fixed on the glazing (1) through the thermally conductive double-sided tape (6). As can be seen on this figure, the thermistor (4) is not in direct contact with the glazing (1) but through the thermally conductive double-sided tape (6).

Figure 2:
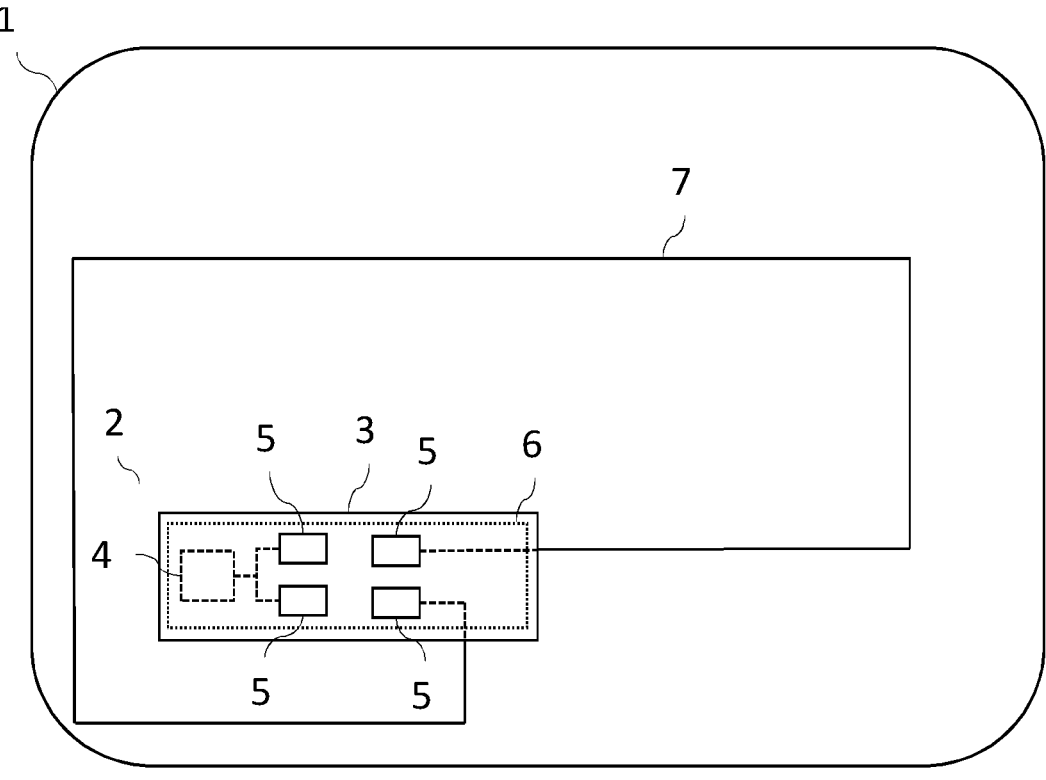
FIG. 2 illustrates a second embodiment of the present invention.

FIG. 2 shows a second embodiment of the present invention. The glazing (1) still comprises the temperature sensing device (2). The glazing (1) further comprises a silverprint (7) distributed on said glazing.

This silverprint is connected to a second couple of connectors which surfaces the second face of the printed circuit board (3).

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

The invention claimed is:

1. A glazing comprising a temperature sensing device for measuring the temperature of said glazing, the temperature sensing device comprising:
   a. a first printed circuit board having a first face and a second face;
   b. a thermistor fixed on the said first face of the printed circuit board;
   c. a first couple of connectors connected to the thermistor and surfacing the second face of the printed circuit board; and
   d. a thermally conductive double-sided tape fixed on the said first face of the printed circuit board;

wherein the glazing comprises a silverprint distributed on said glazing; and the temperature sensing device is fixed to the glazing through the thermally conductive double-sided tape, and comprises a second couple of connectors connected to the silverprint and surfacing the second face of the printed circuit board.

2. The glazing according to claim 1, wherein a volume of the printed circuit board is less than 0.22 cm$^3$ and its largest area is less than 1.1 cm$^2$.

3. The glazing according to claim 1, wherein the glazing is a windshield, a sidelite or a backlite of an automotive vehicle.

4. The glazing according to claim 1, wherein the glazing is a trim element of an automotive vehicle.

5. A temperature sensing device for measuring a temperature of a glazing, the temperature sensing device comprising:

a first printed circuit board having a first face and a second face;

a thermistor fixed on the said first face of the printed circuit board;

a couple of connectors connected to the thermistor and surfacing the said second face of the printed circuit board; and a thermally conductive double-sided tape fixed on the said first face of the printed circuit board, wherein the glazing comprises a silverprint distributed on said glazing; and the temperature sensing device is able to be fixed to the glazing through the thermally conductive double-sided tape and comprises a second couple of connectors connected to the silverprint and surfacing the second face of the printed circuit board.

6. The temperature sensing device according to claim 5, wherein a volume of the printed circuit board is less than 0.22 cm$^3$ and its largest area is less than 1.1 cm$^2$.

7. The temperature sensing device according to claim 5 wherein the temperature sensing device further comprises a second couple of connectors surfacing the second face of the printed circuit board.

8. A glazing comprising a temperature sensing device for measuring the temperature of said glazing, the temperature sensing device comprising:

a. a first printed circuit board having a first face and a second face;

b. a thermistor fixed on the said first face of the printed circuit board;

c. a first couple of connectors connected to the thermistor and surfacing the second face of the printed circuit board; and d. a thermally conductive double-sided tape fixed on the said first face of the printed circuit board;

wherein the temperature sensing device is fixed to the glazing through the thermally conductive double-sided tape and the glazing is a cover glass of a camera or a lidar.

9. The glazing according to claim 8, wherein a volume of the printed circuit board is less than 0.22 cm$^3$ and its largest area is less than 1.1 cm$^2$.

10. The glazing according to claim 8, wherein the glazing further comprises:

a silverprint distributed on said glazing;

wherein the temperature sensing device further comprises:

a second couple of connectors connected to the silverprint and surfacing the second face of the printed circuit board.

11. The glazing according to claim 8, wherein the glazing is a windshield, a sidelite or a backlite of an automotive vehicle.

12. The glazing according to claim 8, wherein the glazing is a trim element of an automotive vehicle.

\* \* \* \* \*